United States Patent [19]
Dhuler et al.

[11] Patent Number: 5,962,949
[45] Date of Patent: Oct. 5, 1999

[54] MICROELECTROMECHANICAL POSITIONING APPARATUS

[75] Inventors: Vijayakumar R. Dhuler, Raleigh; Robert L. Wood, Cary, both of N.C.

[73] Assignee: MCNC, Research Triangle Park, N.C.

[21] Appl. No.: 08/965,277

[22] Filed: Nov. 6, 1997

Related U.S. Application Data

[63] Continuation-in-part of application No. 08/767,192, Dec. 16, 1996.

[51] Int. Cl.$^6$ .......................... H03H 37/32; H01L 37/00
[52] U.S. Cl. ............................................. 310/307
[58] Field of Search ................................ 310/306, 307

[56] References Cited

U.S. PATENT DOCUMENTS

| | | | |
|---|---|---|---|
| 1,258,368 | 9/1918 | Smith | 310/307 |
| 1,658,669 | 2/1928 | Cohn et al. | 310/307 |
| 3,213,318 | 10/1965 | Glenn | 310/317 |
| 3,609,593 | 9/1971 | Bell et al. | 310/307 |
| 4,806,815 | 2/1989 | Honna | 310/307 |
| 5,179,499 | 1/1993 | MacDonald et al. | 361/313 |
| 5,184,269 | 2/1993 | Shimada et al. | 361/24 |
| 5,261,747 | 11/1993 | Deacutis et al. | 374/137 |
| 5,309,056 | 5/1994 | Culp | 310/306 |
| 5,355,712 | 10/1994 | Petersen et al. | 732/4 R |
| 5,367,584 | 11/1994 | Ghezzo et al. | 385/17 |
| 5,441,343 | 8/1995 | Pylkki et al. | 374/137 |
| 5,467,068 | 11/1995 | Field et al. | 335/4 |

(List continued on next page.)

FOREIGN PATENT DOCUMENTS

| | | | |
|---|---|---|---|
| 0 469 749 | 2/1992 | European Pat. Off. | F16K 7/14 |
| 0 478 956 | 4/1992 | European Pat. Off. | H01H 1/00 |
| 0 665 590 | 8/1995 | European Pat. Off. | H01L 23/00 |
| 764821 | 5/1934 | France | 310/306 |
| 38 09 597 | 10/1989 | Germany | G05D 3/00 |
| 792145 | 3/1958 | United Kingdom | 310/306 |

OTHER PUBLICATIONS

Single Crystal Silicon Actuators And Sensors Based On Silicon Fusion Bonding Technology, Semi–Annual Progress Report 1, Advanced Research Projects Agency, Lucas NovaSensor, Contract No. DAL 01–94–C–3411, Apr.—Jul. 1994.

Single Crystal Silicon Actuators And Sensors Based On Silicon Fusion Bonding Technology, Semi–Annual Progress Report 2, Advanced Research Projects Agency, Lucas NovaSensor, Contract No. DAL 01–94–C–3411, Jul., 1994—Jan. 1995.

(List continued on next page.)

*Primary Examiner*—Thomas M. Dougherty
*Attorney, Agent, or Firm*—Alston & Bird LLP

[57] ABSTRACT

A microelectromechanical (MEMS) positioning apparatus is provided that can precisely microposition an object in each of the X, Y and Z directions. The MEMS positioning apparatus includes a reference surface, a support disposed in a fixed position to the reference surface, and a stage defining an XY plane that is suspended adjacent to the support and over at least a portion of the reference surface. The MEMS positioning apparatus also includes at least one and, more typically, several actuators for precisely positioning the stage and, in turn, objects carried by the stage. For example, the MEMS positioning apparatus can include first and second MEMS actuators for moving the stage in the XY plane upon actuation. In addition, the MEMS positioning apparatus can include a Z actuator, such as a thermal bimorph structure, for moving the stage in the Z direction. As such, the MEMS positioning apparatus can precisely position the stage as well as any objects carried by the stage in each of the X, Y and Z directions. As a result of the construction of the MEMS positioning apparatus, the MEMS positioning apparatus can also be fabricated in an affordable, reliable and reproducible manner without compromising the precision alignment provided by the MEMS positioning apparatus.

20 Claims, 6 Drawing Sheets

U.S. PATENT DOCUMENTS

| | | | |
|---|---|---|---|
| 5,475,318 | 12/1995 | Marcus et al. | 324/762 |
| 5,483,799 | 1/1996 | Dalto | 62/3.7 |
| 5,536,988 | 7/1996 | Zhang et al. | 310/309 |
| 5,558,304 | 9/1996 | Adams | 244/134 A |
| 5,600,174 | 2/1997 | Reay et al. | 257/467 |
| 5,602,955 | 2/1997 | Haake | 385/136 |
| 5,606,635 | 2/1997 | Haake | 385/53 |
| 5,629,665 | 5/1997 | Kaufmann et al. | 338/18 |
| 5,644,177 | 7/1997 | Guckel et al. | 310/40 M |
| 5,659,285 | 8/1997 | Takeda | 337/389 |
| 5,722,989 | 3/1998 | Fitch et al. | 606/205 |
| 5,796,152 | 8/1998 | Carr et al. | 257/415 |
| 5,813,441 | 9/1998 | Dewispelaere | 139/455 |
| 5,862,003 | 1/1999 | Saif et al. | 359/871 |
| 5,881,198 | 3/1999 | Haake | 385/136 |

OTHER PUBLICATIONS

Single Crystal Silicon Actuators And Sensors Based On Silicon Fusion Bonding Technology, Semi–Annual Progress Report, Advanced Research Projects Agency, Lucas NovaSensor, Contract No. DAL 01–94–C–3411, Jan.—Jul. 1995.

Single Crystal Silicon Actuators And Sensors Based On Silicon Fusion Bonding Technology, Semi–Annual Progress Report, Advanced Research Projects Agency, Lucas NovaSensor, Contract No. DAL 01–94–C–3411, Jan.—Aug. 1996.

Phipps, Thesis: Design And Developement Of Microswitches For Micro–Electro–Mechanical Relay Matrices, Air Force Inst. of Tech., Wright–Patterson AFB, OH School of Engineering, 1995.

Yamagata, et al., A Micro Mobile Mechanism Using Thermal Expansion And Its Theoretical Analysis—A Comparison With Impact Drive Mechanism Using Piezoelectric Elements, *Proceedings of the IEEE Micro Electro Mechanical Systems*, 1994, pp. 142–147.

Oh, et al., Thin Film Heater On A Thermally Isolated Microstructure, *Smart Materials Fabrication and Materials for Micro–Electro–Mechanical Systems*, 1992, pp. 277–282.

Safranek, The Properties Of Electrodeposited Metals & Alloys, *Amer. Electroplaters &Surface Finishers Society*, 1986, pp. 295–315.

Klassen,et al., Silicon Fusion Bonding And Deep Reactive Ion Etching: A New Technology For Microstructures, *Transducers '95—EUROSENSORS IX, The 8th International Conference On Solid State Sensors And Actuators, and Eurosensors IX*, Stockholm, Sweden, Jun. 25–29, 1995, pp. 556–559.

Noworolski, et al., Fabrication Of SOI Wafers With Buried Cavities Using Silicon Fusion Bonding And Electrochemical Etchback, Transducers '95—EUROSENSORS IX, The 8th International Conference On Solid State Sensors And Actuators, and Eurosensors IX, Stockholm, Sweden, Jun. 25–29, 1995, pp. 71–74.

Klaassen E H et al: "Silicon Fusion Bonding And Deep Reactive Ion Etching: A New Technology For Microstructures" *Sensors and Actuators A*, vol. 52, No. 1/03. Mar. 1996, pp. 132–139.

J.W. Judy, T. Tamagawa and D.L. Polia, Surface Micromachined Linear Thermal Microactuator, International Electron Devices Meeting 1990. Technical Digest (CAT. No. 90CH2865–4, Dec. 1990, pp. 629–632, New York, New York.

Gary K. Fedder and Roger T. Howe, Multimode Digital Control of a Suspended Polysilicon Microstructure, *Journal of Microelectromechanical Systems*, Dec. 1996, pp. 283–297, vol. 5, No. 4.

John H. Comtois and Victor M. Bright, Applications for surface–micromachined polysilicon thermal actuators and arrays, *Sensors and Actuators*, Jan. 1997, pp. 19–25, vol. 58, No. 1.

Liwei Lin and Shiao–Hong Lin, Vertically driven mcroactuators by electrothermal buckling effects, *Sensors and Actuators*, Nov. 1998, pp. 35–39, vol. 71, No. 1–2.

MICROELECTROMECHANICAL POSITIONING APPARATUS

RELATED APPLICATION

This patent application is a continuation-in-part of U.S. patent application Ser. No. 08/767,192 which was filed on Dec. 16, 1996, the contents of which are expressly incorporated in their entirety herein.

FIELD OF THE INVENTION

The present invention relates generally to microelectromechanical devices and, more particularly, to a microelectromechanical positioning apparatus.

BACKGROUND OF THE INVENTION

It is desirable in many applications to precisely align or microposition various objects. Although the precision with which the objects must be positioned varies according to the application, the objects must oftentimes be aligned to within several microns to several tenths of microns. Typical applications that require micropositioning include micromachining applications, the handling or examination of microbiological specimens, and the alignment of an optical fiber, such as a single mode optical fiber, with another optical element. By appropriately micropositioning an optical fiber relative to a laser diode, for example, a large percentage of the optical signals provided by the laser diode can be coupled to the respective optical fiber.

Although several micropositioning devices have been proposed, a need still exists for alignment devices that incorporate improved micropositioning techniques. For example, increased demands are being made upon the precision with which objects, such as optical fibers, are aligned. As such, there is a need for more precise alignment devices that provide reliable and repeatable micropositioning to within a few microns to several tenths of microns. In addition, many applications now require that the objects be micropositioned in not just two directions, but all three orthogonal directions, that is, the X, Y and Z directions. As such, there is also a need for improved alignment devices that precisely align an object in each of the X, Y and Z directions. Although the precision with which objects must be aligned is ever increasing, an increasing emphasis is being placed on reducing or at least limiting the cost of the alignment devices. As such, alignment devices are needed that can be fabricated in an affordable and efficient manner without compromising the alignment precision of the resulting alignment device.

SUMMARY OF THE INVENTION

According to the present invention, a microelectromechanical (MEMS) positioning apparatus that is capable of being manufactured in an affordable, repeatable and reliable manner is provided that can precisely microposition an object in each of the X, Y and Z directions. The MEMS positioning apparatus includes a reference surface, a support disposed in a fixed position to the reference surface and a stage that is suspended adjacent to the support and over at least a portion of the reference surface. The stage has opposed first and second major surfaces and defines an XY plane. The stage is suspended over the reference surface, generally by means of one or more springs extending between the support and the stage, such that the first major surface faces the reference surface. Typically, the object to be positioned or aligned, such as an optical fiber or the like, is fixed in position upon the second major surface of the stage so that the object can be precisely positioned by correspondingly moving or positioning the stage.

According to one advantageous embodiment, the MEMS positioning apparatus also includes a first MEMS actuator for moving the stage in the XY plane upon actuation. The MEMS positioning apparatus of this embodiment can also include a second MEMS actuator for positioning the stage in the XY plane in the direction perpendicular to the direction of movement created by the first MEMS actuator. As such, the MEMS positioning apparatus of this embodiment can precisely position the stage in both X and Y directions.

According to this embodiment, each MEMS actuator includes spaced apart anchors disposed in a fixed position relative to the support and an arched beam extending between the spaced apart anchors. Each MEMS actuator also includes means for heating the arched beam to cause further arching of the beam. Preferably, the heating means includes a heater extending between first and second opposed ends which, in turn, are generally disposed upon the support. In order to effectively transfer heat from the heater to the arched beam, the arched beam extends over and is spaced, albeit slightly, from the heater such that the heat generated by the heater causes the arched beam to further arch. As such, each MEMS actuator effectively converts the heat generated by the heater into mechanical motion of the arched beam. Each MEMS actuator also preferably includes a lengthwise extending actuator member connected to the arched beam and extending outwardly toward the stage. The stage of this embodiment also preferably includes a contact member disposed in a fixed position upon the stage such that the end portion of the actuator member contacts the contact member upon actuation of the respective MEMS actuator, thereby controllably moving the stage and any objects carried by the stage in the XY plane.

According to one advantageous embodiment, the MEMS positioning apparatus can include an actuator for moving the stage and any objects carried by the stage in a Z direction, perpendicular to the XY plane defined by the stage. According to this embodiment, the first major surface of the stage preferably includes a recessed portion. The MEMS positioning apparatus of this embodiment also includes an actuator disposed on the stage and at least partially overlying the recessed portion of the stage. Upon actuation, the actuator therefore bends the stage and any objects carried by the stage toward and into contact with the underlying reference surface so as to thereby controllably move the stage in the Z direction.

According to one advantageous embodiment, the stage defines an elongated tongue portion upon which the actuator is disposed. Preferably, a portion of the first major surface underlying the elongated tongue portion of the stage is recessed to thereby improve the flexibility of the elongated tongue portion. As such, actuation of the actuator bends the elongate tongue portion toward and into contact with the underlying reference surface so as to thereby move the stage in the Z direction.

The actuator for positioning the stage in the Z direction is typically a thermal bimorph structure having a first layer, generally formed of a conductive material, and a second layer formed of a material having a lower coefficient of expansion than the first layer. In order to further improve the flexibility of the actuator of this advantageous embodiment, the first layer preferably defines one or more slits. In this vein, the flexibility of the stage can be further improved by defining several apertures that open through the recessed portion of the first surface of the stage.

The MEMS positioning apparatus of the present invention preferably includes the first and second MEMS actuators as well as an actuator, such as a thermal bimorph actuator, for moving the stage in the Z direction. Thus, the MEMS positioning apparatus of this advantageous embodiment can precisely position the stage in each of the X, Y and Z directions relative to the reference surface. As a result of the construction of the MEMS positioning apparatus of the present invention, the MEMS positioning apparatus can also be fabricated in an affordable, reliable and reproducible manner without compromising the precision alignment provided by the MEMS positioning apparatus.

DETAILED DESCRIPTION OF THE EMBODIMENT

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
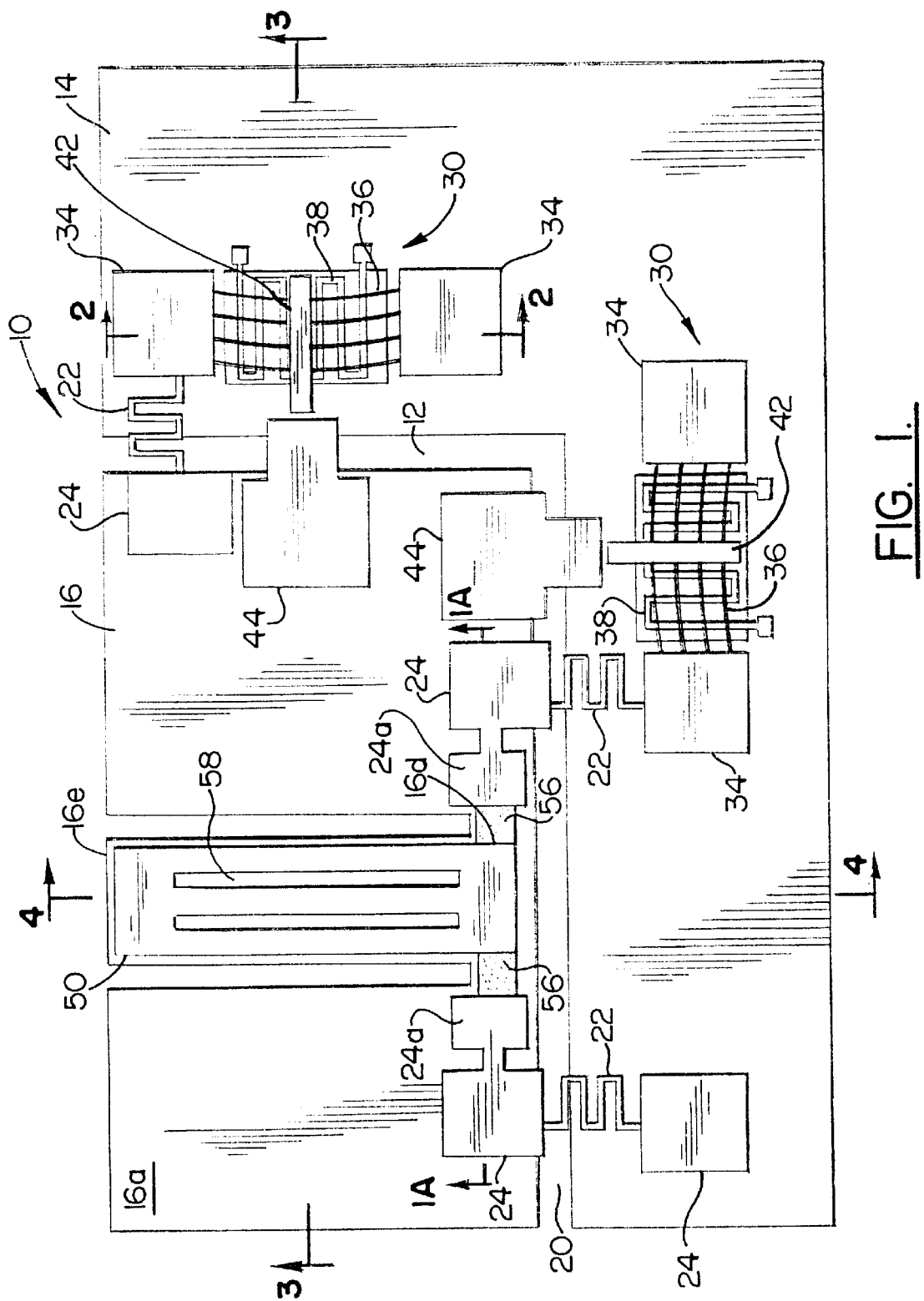
FIG. 1 is a top view of a MEMS positioning apparatus according to one embodiment of the present invention.

Referring now to FIG. 1, a first embodiment of a MEMS positioning apparatus 10 according to the present invention is illustrated. As described below, the MEMS positioning apparatus is designed to precisely position objects, such as during micro-assembly operations, during manipulation of microbiological specimens, during alignment of an optical fiber with a laser diode or other optical elements.

The MEMS positioning apparatus 10 includes a reference surface 12, a support 14 disposed in a fixed position relative to the reference surface, and a stage 16 suspended adjacent the support and over at least a portion of the reference surface. While the support, the reference surface and the stage can be formed of a variety of materials, the support, the reference surface and the stage are typically formed of the same material, such as silicon, glass or quartz. While the support and the reference surface can be an integral or monolithic structure that is fabricated from the same substrate, the support and the reference surface are typically two separate elements that are disposed or mounted in a fixed position relative to one another. In this regard, the support is generally attached to a reference wafer which forms the reference surface by means of electrostatic bonding, eutectic bonding, glue or the like.

Figure 3:
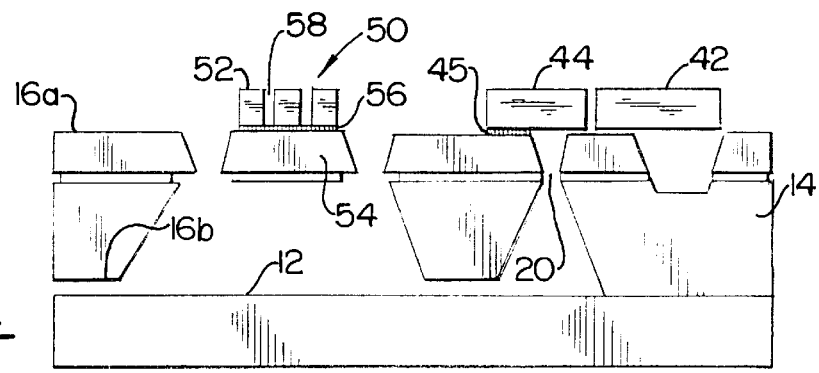
FIG. 3 is a cross-sectional view of the MEMS positioning apparatus of FIG. 1 taken along line 3—3.
Figure 4:
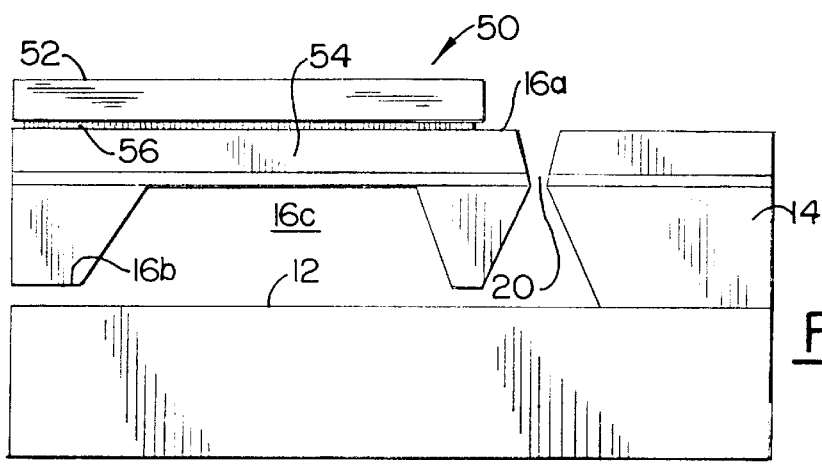
FIG. 4 is a cross-sectional view of the MEMS positioning apparatus of FIG. 1 taken along line 4—4 that illustrates the elongate tongue portion prior to actuation.

As shown in FIG. 1 and in more detail in the cross-sectional views of FIGS. 3 and 4, the support 14 generally extends upwardly from the reference surface 12 to thereby define a cavity within which the stage 16 is suspended. While the illustrated embodiment of the stage has a generally rectangular shape, the stage can have other shapes without departing from the spirit and scope of the present invention. Regardless of the shape of the stage, however, the support is disposed adjacent to at least one and, more preferably, two sides of the stage. In addition, the support is preferably separated from the stage by a relatively small gap 20, typically at least 10 microns.

The stage 16 preferably has opposed first and second major surfaces 16a, 16b and defines an XY plane as well as a Z axis perpendicular to the XY plane. Although not necessary for the practice of the present invention, the stage is preferably suspended within the cavity defined by the reference surface 12 and the support 14 such that the second major surface of the stage, i.e., the upper surface, is generally coplanar with the upper surface of the support.

The stage 16 is preferably suspended over the reference surface 12 by means of suspension springs 22 that extend or bridge between the support 14 and the stage. As shown in FIG. 1, for example, the suspension springs can extend between a pair of anchors 24, one anchor being placed on the stage and one anchor being placed on the support. The anchors and the suspension springs are preferably formed of a metal, such as nickel or a nickel-phosphorous alloy, that is deposited on the support by means of an electroplating process in order to have a high aspect ratio. As known to those skilled in the art, electroplating techniques include, but are not limited to "LIGA" techniques. The anchors are preferably separated from the stage and the support by means of a dielectric layer, such as silicon nitride, in order to electrically isolate the anchors from the stage and the support.

In order to suspend the stage 16 over the reference surface 12 in a relatively even manner such that the second major surface 16b of the stage is generally parallel and, more preferably, coplanar with the upper surface of the support 14, the MEMS positioning apparatus 10 preferably includes two or more suspension springs 22 that are spaced about the periphery of stage. For example, the suspension springs can extend between the support and respective corners of the stage.

In order to provide movement of the stage 16 relative to the support 14 and, in turn, relative to the reference surface 12, the MEMS positioning apparatus 10 preferably includes an actuator. In order to provide controlled movement of the stage in the X and/or Y directions, the MEMS positioning apparatus preferably includes a first MEMS actuator 30 disposed upon the support adjacent to one side of the stage. As described hereinbelow and as illustrated in FIG. 1, the MEMS positioning apparatus typically includes first and second MEMS actuators disposed upon the support so as to provide controlled movement of the stage in both the X and Y directions. As such, actuation of the first MEMS actuator will move the stage in the X direction, while actuation of the second MEMS actuator will move the stage in the Y direction. Although the MEMS actuators can be designed to provide different amounts of displacement, the MEMS actuators of one advantageous embodiment provide at least 20 microns of displacement in each of the X and Y directions.

A MEMS actuator 30 of one advantageous embodiment is described in U.S. patent application Ser. No. 08/767,192 entitled "Thermal Arched Beam Microelectromechanical Actuators" filed Dec. 16, 1996 and in U.S. patent application Ser. No. 08/936,598 entitled "Thermal Arched Beam Microelectromechanical Devices and Associated Fabrication Methods" filed Sep. 24, 1997, the contents of both of which are incorporated in their entirety herein. As shown in FIG. 1 and in more detail in FIG. 2, each MEMS actuator includes a pair of spaced apart supports or anchors (hereinafter termed "anchors") 34 on the upper surface of the support. The spaced apart anchors are preferably formed of metal, such as nickel, that is deposited on the upper surface of the support 14, typically by means of the same electroplating process which forms the suspension springs 22 and the associated anchors 24. As shown in FIG. 1, for example, the same structure can serve as an anchor for both a MEMS actuator and a spring.

Each MEMS actuator 30 also includes at least one and, more preferably, a number of arched beams 36 extending between the spaced apart anchors 34. Although a MEMS actuator can have any number and any size of arched beams, the MEMS actuator of one embodiment includes five arched beams which are 5 μm wide, 30 μm tall and 2 mm in length. The arched beams are also typically formed of a conductive material which has a positive coefficient of thermal expansion so that the arched beam expands as the arched beam is heated. In particular, the arched beams are preferably formed of a metal and, more preferably, are formed of nickel or a nickel-phosphorous alloy. As described above in conjunction with the spaced apart anchors, the arched beams are also preferably formed by electroplating so as to have high aspect ratios. For example, the aspect ratio of the arched beams is preferably greater than 1.5:1 and more preferably is about 3:1. As shown in FIG. 1, the arched beams are arched in a direction which preferably extends parallel to the upper surface of the support 14. Although the arched beams are freed from the support, typically by means of a release layer and wet etching as described in U.S. patent application Ser. No. 08/936,598 entitled "Thermal Arched Beam Microelectromechanical Devices and Associated Fabrication Methods" filed Sep. 24, 1997, the arched beams remain anchored at the spaced apart anchors and are arched toward the desired or predetermined direction of motion, i.e., toward the stage 16.

Each MEMS actuator 30 also includes means for applying heat to the arched beams 36. The applied heat causes further arching of the beams as a result of the thermal expansion of the beams. The arching of the beams preferably occurs in the predetermined direction of motion so as to cause displacement of the arched beams in a direction toward the stage 16. While a variety of techniques can be employed to heat the arched beams, the first and second MEMS actuators of the illustrated embodiment include an external heater 38. The external heater extends between first and second opposed ends that commonly serve as contact pads for establishing electrical contact with the heater. As shown in FIG. 1, the heater of one advantageous embodiment winds back and forth in a sinuous path beneath the metallic arched beams such that heat generated by the sinuous heater heats the metallic arched beams in a relatively even fashion.

Although the first and second ends of the heater 38 are disposed on the upper surface of the support 14, a portion of the support underlying the remainder of the heater, i.e., the medial portion of the heater, can be etched or otherwise removed in order to further thermally isolate the heater from the support, as described hereinbelow and as shown in FIG. 3. As shown in FIG. 1, the heater can extend in a cantilevered fashion over the cavity 14a defined within the support or, alternatively, the cavity defined by the substrate may be covered by a diaphragm, typically formed of a dielectric material such as silicon nitride, in order to structurally support the heater while maintaining sufficient thermal isolation between the heater and the support. Although not shown, a medial portion of the heater extending over the cavity defined in the support can be further supported by link, typically also formed of a dielectric material such as silicon nitride, that bridges between the heater and another portion of the upper surface of the support.

As described hereinbelow, the heater 38 generally includes a core 38a formed of an at least partially conductive material having a high resistivity, such as resistivity of at least $5 \times 10^{-6}$ Ω•cm, and a coating 38b formed of a dielectric material surrounding the at least partially conductive material. In one embodiment, the heater includes a core of polysilicon, titanium or tungsten that is surrounded by a coating of silicon nitride or silicon dioxide. As shown in cross-section in FIG. 2, the arched beams 36 are electrically isolated from the at least partially conductive core of the heater by a combination of an air gap 40 and the dielectric coating of the heater. In order to transfer heat generated by the heater to the arched beam in the most efficient manner, the air gap is preferably reduced as much as possible while still maintaining sufficient electrical isolation. In one advantageous embodiment, the air gap is less than 5 microns and, more preferably, between 1 micron and 2 microns. For the embodiment in which the air gap is between 1 micron and 2 microns, the dielectric material covering the portion of the at least partially conductive material that faces the arched beam has a thickness of about 0.25 micron.

Figure 2:
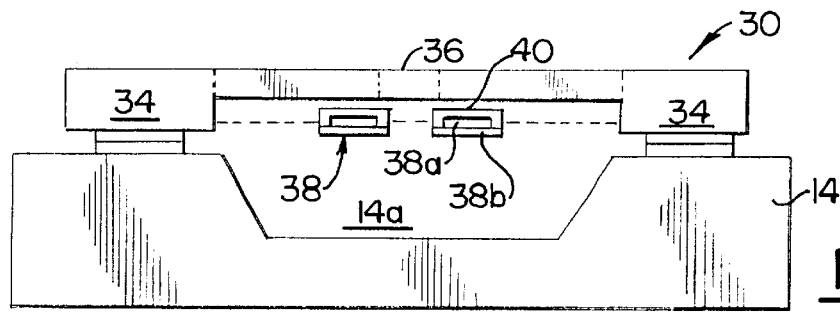
FIG. 2 is a cross-sectional view of a MEMS actuator of the MEMS positioning apparatus of FIG. 1 taken along line 2—2.

The first and second MEMS actuators 30 of the MEMS positioning apparatus 10 of the present invention each also preferably include a lengthwise extending actuator member 42 coupled to the arched beams 36 and extending outwardly therefrom. The actuator member mechanically couples the plurality of arched beams at a point, typically the midpoint, between the spaced apart anchors 34 as shown in FIGS. 1 and 2. As such, further arching of the arched beams in the predetermined direction displaces the actuator member in the same predetermined direction, i.e., in a direction toward the stage 16. By configuring multiple arched beams in an array, each MEMS actuator enjoys force multiplication so that a large force and a large displacement may be provided. Moreover, by mechanically connecting multiple beams with the actuator member, each MEMS actuator also enjoys a stiffening effect so as to be capable of providing even higher degrees of force than would be available by these same number of individual arched beams operating independently.

Although the first and second MEMS actuators 30 are preferably heated by means of an external heater 38 as described above and shown in FIGS. 1 and 2, either MEMS actuator could, instead, be heated by passing current through the arched beams 36 or by combination of heating created by the external heater and by passing current through the arched beams. In addition, either or both MEMS actuators could be heated by other external heating means, such as a hot plate, an oven, infra red light, radiation or the like. In embodiments in which in the first and second MEMS actuators include respective external heaters, the heaters can take a variety of shapes, such as the sinuous heater shown in FIGS. 1 and 2 or a heater that underlies and is aligned with the actuator member 42, for example.

In order to controllably move the stage 16 in the X and/or Y directions relative to the support 14 and, in turn, to the reference surface 12, the arched beams 36 of the first and second MEMS actuators 30 are heated, such as by passing current through the respective external heaters 38. As such, the arched beams further arch in a predetermined direction toward the stage such that an end portion of the actuator member operably contacts the stage, thereby moving the stage and any objects carried by the stage in the predetermined direction. For example, actuation of the first MEMS actuator will move the stage in the X direction, while actuation of the second MEMS actuator will move the stage in the Y direction.

Instead of directly contacting the stage 16, the actuator member 42 of each MEMS actuator 30 preferably contacts a respective contact member 44 that is disposed in a fixed position upon the stage. As shown in FIGS. 1 and 3, each contact member is preferably positioned along an edge of the stage adjacent a respective MEMS actuator and aligned with the actuator member of the respective MEMS actuator. The contact members are also preferably formed of a metal, such as nickel or a nickel-phosphorous alloy, that is electroplated onto the stage in order to have a high aspect ratio. The contact members are also preferably separated from the stage by means of a dielectric layer 45, such as silicon nitride, in a like fashion to that described above.

Preferably, the spacing between an actuator member 42 and a respective contact member 44 is relatively small in order to reduce the distance that the actuator member must travel prior to contacting the respective contact member and moving the stage 16. Typically, the size of the spacing between an actuator member and a respective contact member is defined by lithography and, in one advantageous embodiment, is 10 microns.

Figure 6:
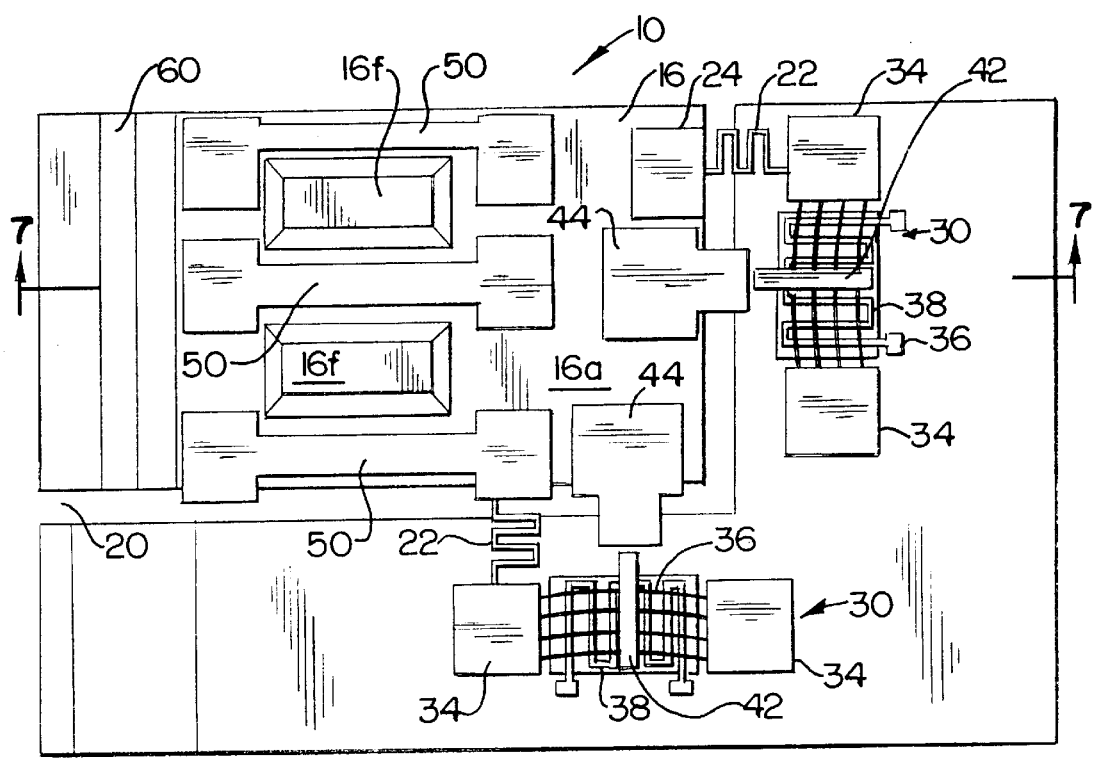
FIG. 6 is a top view of another embodiment of a MEMS positioning apparatus according to the present invention.

In order to provide movement of the stage 16 in the Z direction, the MEMS positioning apparatus 10 preferably includes another actuator 50 disposed on the stage such that actuation of this actuator bends the stage into contact with the underlying reference surface 12. Although the MEMS positioning apparatus could include different types of Z actuators, the Z actuator of one advantageous embodiment is a thermal bimorph structure having first and second layers. The first layer 52 is typically formed of a conductive material such as a metal and, more particularly, such as nickel or a nickel-phosphorous alloy, having a relatively large coefficient of expansion. The second layer 54 is formed of a material having a lower or smaller coefficient of expansion than the material forming the first layer. Typically, the first layer is formed of the same material as the other metallic structures, such as the springs and the MEMS actuators, such that the first layer can be deposited during the same electroplating process. As shown in FIG. 6, for example, the same structure can serve as an anchor for a spring and can form a portion of the first layer of a Z actuator. In addition, the material forming the second layer is generally silicon and, in some advantageous embodiments such as shown in cross section in FIGS. 3 and 4, may actually be formed by a portion of the stage itself.

Upon heating the thermal bimorph structure that forms the Z actuator 50, the first and second layers expand in different amounts or to different degrees due to the different coefficients of thermal expansion of the materials forming the first and second layers, respectively. As a result of this differential expansion, the Z actuator bends in a controlled fashion. In order to force the Z actuator to bend downwardly toward the underlying reference surface 12, the first layer 52 formed of the material having the larger coefficient of expansion is preferably disposed upon or on top of the second layer 54 that is formed of the material having a lower coefficient of expansion as shown in FIGS. 3 and 4.

Figure 5:
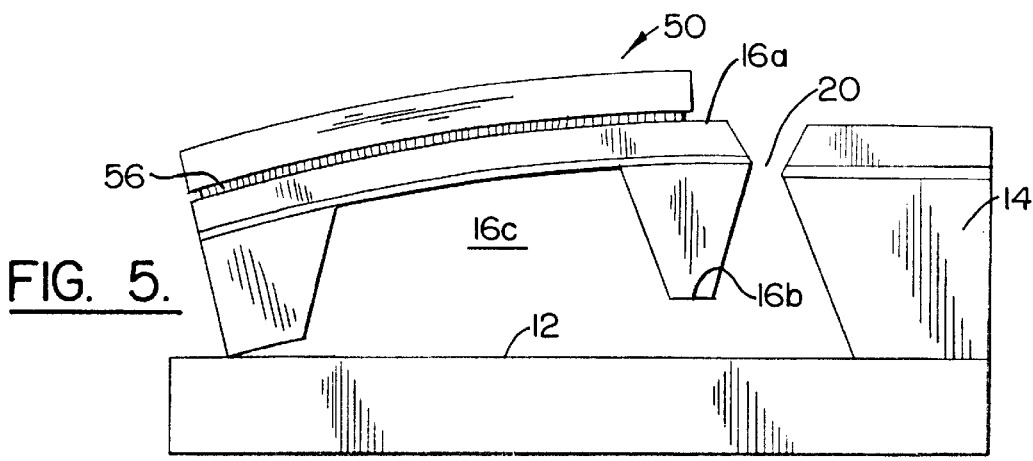
FIG. 5 is a cross-sectional view of the MEMS positioning apparatus of FIG. 1 taken along line 4—4 that illustrates the elongate tongue portion following actuation.

The thermal bimorph structure of the Z actuator 50 can be heated in a variety of manners as known to those skilled in the art. For example, current can be passed directly through the first layer formed of the more conductive material. As illustrated, however, the Z actuator can also include a heater 56 disposed between the first and second layers. While the heater can be fabricated from a variety of materials, the heater of one advantageous embodiment includes a core 56b formed of an at least partially conductive material having a high resistivity, such as resistivity of at least $5 \times 10^{-6}$ $\Omega \cdot$cm, and a coating 56a, 56c formed of a dielectric material surrounding the at least partially conductive material. In one embodiment, the heater includes a core of polysilicon, titanium or tungsten that is surrounded by a coating of silicon nitride or silicon dioxide. By passing current through the heater, the heater heats the first and second layers which expand in different amounts so as to cause the Z actuator to bend. In the embodiment of the MEMS positioning apparatus illustrated in FIG. 1, for example, the Z actuator will bend downwardly as shown in FIG. 5 so as to contact the underlying reference surface 12 and lift the remainder of the stage 16 upwardly.

Figure 1A:
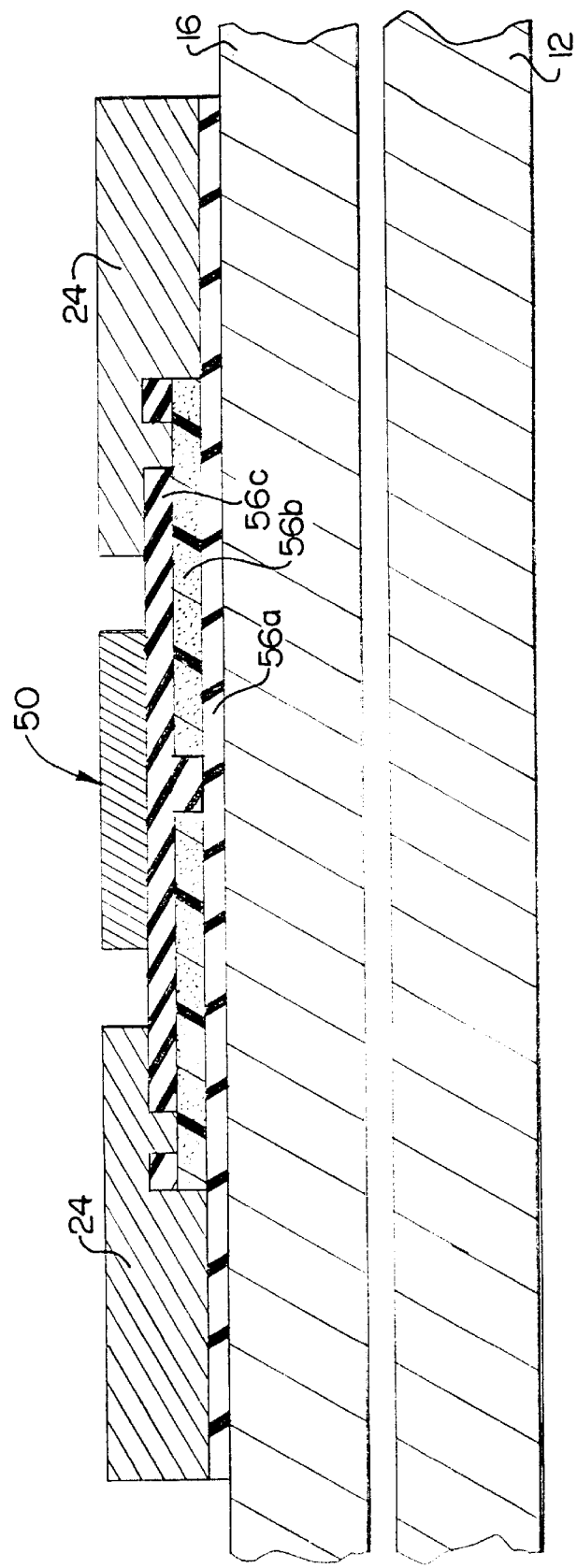
FIG. 1A is a cross-sectional view of a portion of the MEMS positioning apparatus of FIG. 1 taken along line 1A—1A.

As shown in FIG. 1, the heater 56 is preferably deposited upon the stage 16 so as to extend beyond the Z actuator 50. In particular, opposite ends of the heater preferably extend beyond the Z actuator to respective contact pads 24a for establishing electrical contact with the heater. In this regard, the contact pads are preferably disposed upon a portion of the stage near the Z actuator in order to minimize electrical losses. As shown in FIG. 1A, the dielectric coating 56c preferably defines an opening underlying each contact pad for permitting the conductive material of the contact pad to contact the core 56b of the heater.

The contact pads 24a are typically formed of a conductive material, such as nickel or a nickel-phosphorous alloy. Moreover, in one advantageous embodiment, the contact pads are extensions of respective ones of the suspension spring anchors 24. As such, electrical contact can be established with the contact pads via the suspension springs 22 by means of the corresponding suspension spring anchors that are disposed upon the support 14.

In order to facilitate bending of the stage 16 in a controlled fashion, a portion of the stage that underlies the Z actuator 50 is preferably etched to define a recessed portion 16c opening through the first major surface 16a of the stage that faces the underlying reference surface 12. As such, actuation of the Z actuator will primarily cause the recessed portion of the stage to bend.

In the embodiment shown in FIG. 1, for example, the stage 16 defines an elongate tongue portion that is attached to the remainder of the stage at a proximal end 16d and is otherwise separated from the stage. According to this embodiment, the Z actuator 50 is disposed at least partially upon the elongate tongue portion such that actuation of the Z actuator bends the elongate tongue portion downwardly toward the underlying reference surface 12. As such, the portion of the stage underlying the medial portion of the elongate tongue portion is preferably recessed as shown in FIGS. 4 and 5 to facilitate the bending of the elongate tongue portion upon actuation of the Z actuator.

Preferably, the Z actuator 50 is actuated until the lower surface 16b of the stage 16 contacts the reference surface 12, thereby lifting the remainder of the stage upwardly, i.e., in the Z direction, as shown in FIG. 5. As will be apparent to those skilled in the art, those portions of the stage which are not recessed, i.e., the thicker portions of the stage, will typically contact the underlying reference surface upon actuation of the Z actuator. For example, the distal portion 16e of the Z actuator of the MEMS positioning apparatus 10 of FIG. 1 is preferably the full thickness of the stage such that upon actuation of the Z actuator, the medial portion of the Z actuator bends, thereby deflecting the distal portion of the Z actuator downwardly and into contact with the reference surface such that further actuation of the Z actuator will lift the remainder of the stage upwardly. As such, any object carried by the stage will also be lifted upwardly in a controlled fashion.

In order to further increase the flexibility of the Z actuator 50, the first layer 52 of the Z actuator that is formed of the more conductive material can define one or more slits 58 that generally extend lengthwise along the Z actuator. In addition, in the embodiment of the MEMS positioning apparatus 10 of FIG. 1 in which the Z actuator extends in a cantilevered fashion from the remainder of the stage, the dimensions of the Z actuator can also be varied in order to correspondingly vary the flexibility of the Z actuator.

Figure 7:
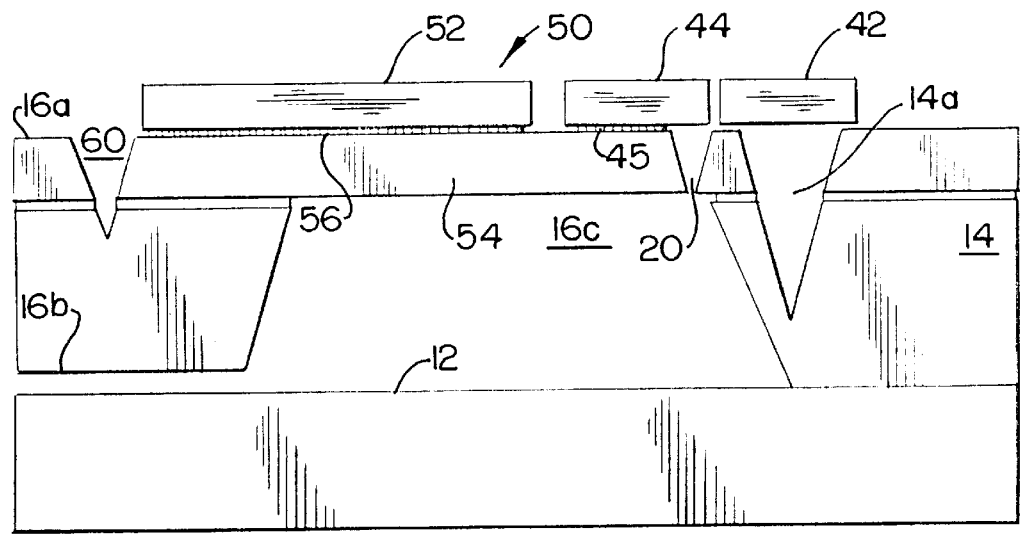
FIG. 7 is a cross-sectional view of the MEMS positioning apparatus of FIG. 6 taken along line 7—7 prior to actuation of the Z actuator.
Figure 8:
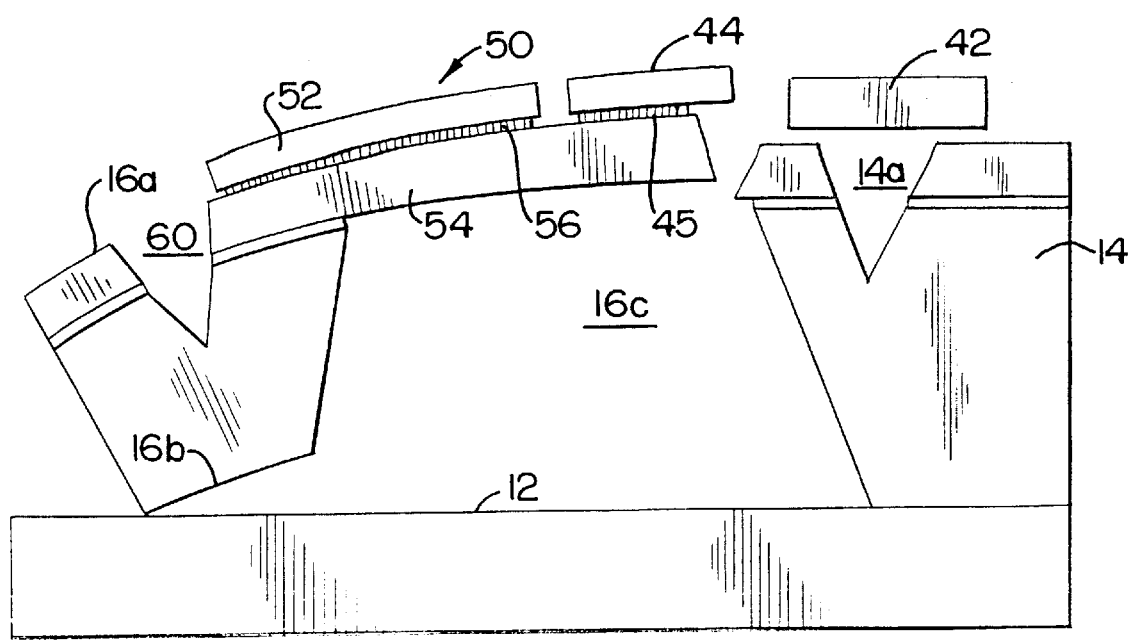
FIG. 8 is a cross-sectional view of the MEMS positioning apparatus of FIG. 6 taken along line 7—7 following actuation of the Z actuator.

As shown in FIGS. 6 and 7, the MEMS positioning apparatus 10 of another embodiment can include multiple Z actuators 50. According to this embodiment, the Z actuators are generally disposed upon the upper surface 16b of the stage 16 so as to extend in parallel across a portion of the stage. As such, concurrent actuation of the multiple Z actuators will further increase the bending force which bends at least a portion of the stage downwardly into contact with the reference surface 12. As shown in FIG. 8, actuation of the Z actuators 50, such as by passing current through the heaters 56 that are positioned between the first and second layers of the respective Z actuators, will cause a recessed portion of the stage to bend until those portions of the stage which are not recessed, i.e., the thicker portions of the stage, contact the underlying reference surface 12. For example, the edge portion of the stage of the MEMS positioning apparatus of FIG. 6 is preferably the full thickness such that upon actuation of the Z actuators, the recessed portion of the stage is bent, thereby deflecting the edge portion of the stage downwardly and into contact with the reference surface such that further actuation of the Z actuators will lift the remainder of the stage upwardly. See FIG. 8. As such, any object carried by the stage will also be lifted upwardly in a controlled fashion.

While a single heater 56 is shown to pass between the first and second layers of each of the Z actuators 50 in the embodiment of FIG. 6, each Z actuator can include a separate heater, if so desired. As such, the Z actuators could be heated and, therefore, actuated in different amounts. In addition to including a recessed portion 16c that opens through the first major surface 16a of the stage 16, i.e., the lower surface of the stage, the stage can define one or more openings 16f as shown in FIG. 6 so as to further increase the flexibility of the stage.

As a result of the controlled movement of the stage 16 in the X, Y and Z directions, the MEMS positioning apparatus 10 of the present invention can precisely position objects placed upon the stage in a precisely controlled and reliable fashion. For example, the MEMS positioning apparatus can align objects to within 0.2 microns. As such, the MEMS positioning apparatus can be utilized in a wide variety of applications, such as micro-positioning applications, manipulation of microbiological specimens, optical fiber alignment or the like. With respect to optical fiber alignment applications, the stage can define a groove 60, typically a V-shaped groove, for receiving and securely holding an optical fiber as shown in FIGS. 5 and 6. As such, movement of the stage will also move the optical fiber in a like manner. The MEMS positioning apparatus can therefore precisely align an optical fiber, such as a single mode optical fiber, with a laser diode or other optical element.

Figure 9:
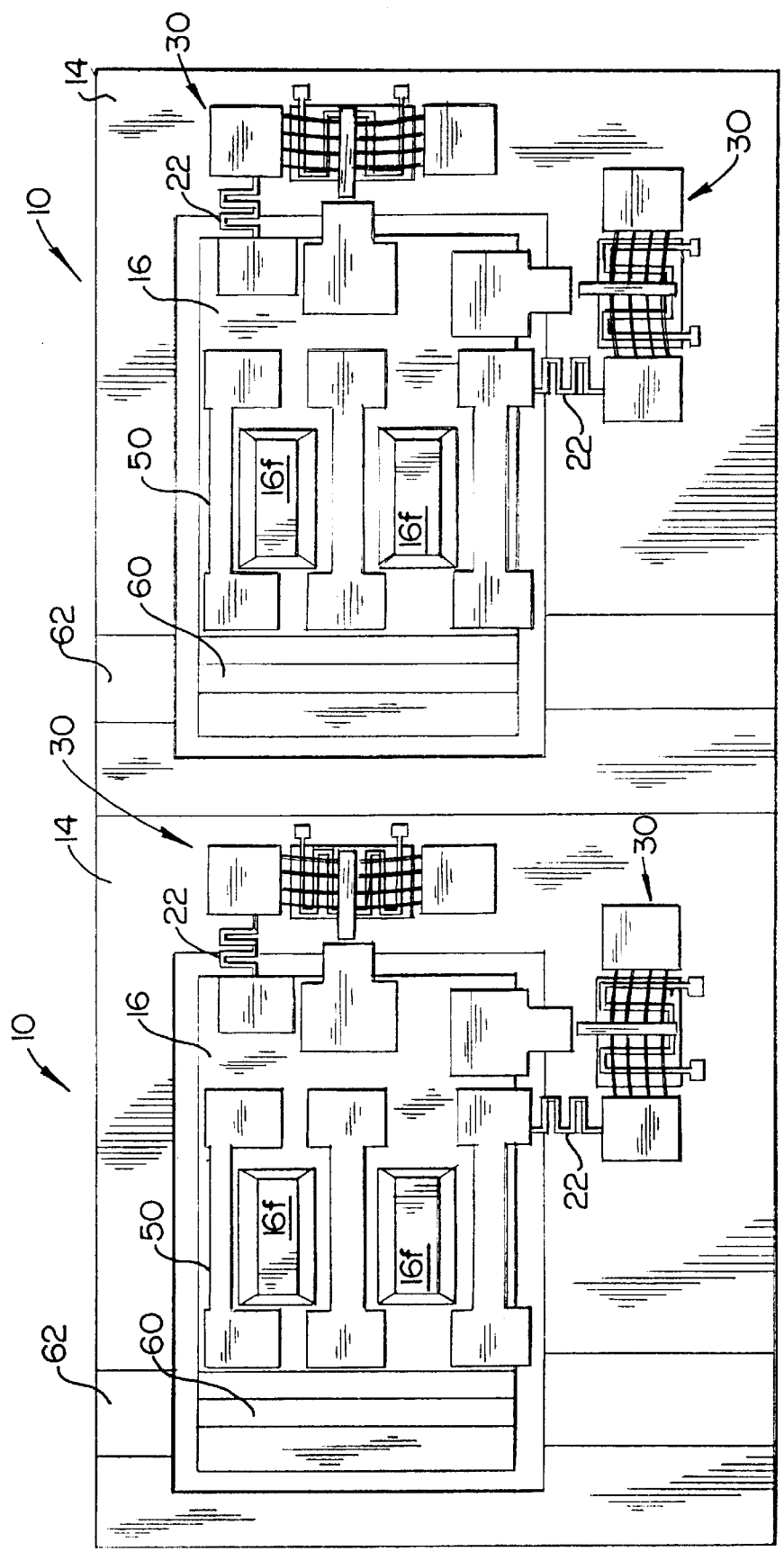
FIG. 9 is a top view of a pair of MEMS positioning apparatus fabricated on the same substrate according to one embodiment of the present invention.

As shown in FIG. 9, multiple MEMS positioning apparatuses 10 can be formed upon a single substrate in order to provide concurrent alignment of a number of objects. For example, the multiple MEMS positioning apparatuses can align a plurality of optical fibers with respective laser diodes or other optical elements. As also shown in FIG. 9, the laser diodes or other optical elements are also preferably mounted in fixed positions 62 relative to the substrate. By defining the positions at which the laser diodes or other optical elements will be mounted prior to the fabrication of the MEMS positioning apparatus, the subsequent fabrication process can utilize the predefined positions for reference purposes in order to insure that each MEMS positioning apparatus is fabricated in general or coarse alignment with the respective laser diode or other optical element. Preferably, the coarse alignment provided by the fabrication process insures that any initial misalignment of the optical fiber carried by the stage with respect to the laser diode or other optical element will be less than the range of motion of the MEMS positioning apparatus, i.e., less than 20 microns in each of the X, Y and Z directions, for example. By controllably actuating the respective actuators of the MEMS positioning apparatus, the optical fiber carried by the stage can then be precisely aligned with the laser diode or other optical element. Although the foregoing alignment process is described above in conjunction with the alignment of an optical fiber, the MEMS positioning apparatus of the present invention can align a variety of other objects in a similar manner.

Although not necessary for the practice of the present invention, the stage 16 and the support 14 are preferably formed of a silicon on insulator (SOI) wafer. As shown by the cross-sectional drawings, the SOI wafer includes an upper layer of single crystal silicon, an intermediate layer of oxide having a thickness of approximately 0.5 microns to about 1 micron, and a lower layer of a bulk substrate material, such as silicon, that is generally much thicker than the other layers. As described above, the support is, in turn, generally bonded to the reference surface 12 defined by a reference wafer.

The first and second MEMS actuators 30 are preferably fabricated upon the SOI wafer according to the process described by co-pending U.S. patent application Ser. No. 08/936,598 entitled "Thermal Arched Beam Microelectromechanical Devices and Associated Fabrication Methods" filed Sep. 24, 1997. As described therein, the suspension springs 22 and associated anchors 24, the contact pads 24a as well as the first layer 52 of conductive material of the Z actuator 50 can be cofabricated with the arched beams 36 and spaced apart anchors 34 of the first and second MEMS actuators during a common electroplating step. In addition, the heater 56 that heats the first and second layers of the Z actuator is preferably cofabricated with the heaters 38 of the first and second MEMS actuators. As a result of the construction of the MEMS positioning apparatus 10 of the present invention, the MEMS positioning apparatus can also be fabricated in an affordable, reliable and reproducible manner without compromising the precision alignment provided by the MEMS positioning apparatus.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims.

Although specific terms are employed herein, they are used in a generic and descriptive sense only and not for purposes of limitation.

That which is claimed:

1. A microelectromechanical positioning apparatus comprising:
   a reference surface;
   a support disposed in a fixed position relative to the reference surface;
   a stage defining an XY plane and suspended from said support and over at least a portion of the reference surface; and
   a first microelectromechanical actuator comprising:
   spaced apart anchors disposed upon said support;
   an arched beam extending between said spaced apart anchors; and
   an actuator member operably coupled to said arched beam and extending outwardly therefrom for moving said stage in the XY plane upon thermal actuation of said first microelectromechanical actuator.

2. A microelectromechanical positioning apparatus according to claim 1 wherein said first microelectromechanical actuator further comprises means for heating said arched beam to cause further arching of said beam such that said actuator member operably contacts and controllably positions said stage in the XY plane.

3. A microelectromechanical positioning apparatus according to claim 1 further comprising a second microelectromechanical actuator for positioning said stage in the XY plane in a direction perpendicular to the direction of movement created by said first microelectromechanical actuator.

4. A microelectromechanical positioning apparatus according to claim 1 wherein said stage comprises a contact member disposed in a fixed position upon said stage and positioned such that an end portion of said actuator member contacts said contact member upon actuation of said first microelectromechanical actuator.

5. A microelectromechanical positioning apparatus according to claim 1 wherein said stage has opposed first and second major surfaces and is suspended such that the first major surface faces the reference surface, wherein the first major surface of said stage includes a recessed portion, and wherein the microelectromechanical positioning apparatus further comprises an actuator disposed on said stage and at least partially overlying the recessed portion of said stage such that actuation of said actuator bends said stage toward the underlying reference surface to thereby move said stage in a Z direction perpendicular to the XY plane.

6. A microelectromechanical positioning apparatus according to claim 1 further comprising at least one spring extending between said support and said stage for suspending said stage above said reference surface.

7. A microelectromechanical positioning apparatus comprising:
   a reference surface;
   a support disposed in a fixed position relative to the reference surface;
   a stage having opposed first and second major surfaces and defining an XY plane, wherein said stage is suspended from said support and over at least a portion of the reference surface such that the first major surface faces the reference surface; and wherein the first major surface of said stage includes a recessed portion; and
   an actuator disposed on said stage and at least partially overlying the recessed portion of said stage such that actuation of said actuator bends said stage toward the underlying reference surface to thereby move said stage in a Z direction perpendicular to the XY plane.

8. A microelectromechanical positioning apparatus according to claim 7 further comprising at least one microelectromechanical actuator disposed upon said support for controllably moving said stage in the XY plane.

9. A microelectromechanical positioning apparatus according to claim 8 wherein said microelectromechanical actuator comprises:
   spaced apart anchors disposed upon said support;
   an arched beam extending between said spaced apart anchors;
   an actuator member operably coupled to said arched beam and extending outwardly therefrom toward said stage; and
   means for heating said arched beam to cause further arching of said beam such that said actuator member controllably positions said stage in the XY plane.

10. A microelectromechanical positioning apparatus according to claim 7 wherein said stage defines an elongate tongue portion, and wherein said actuator is disposed upon said elongate tongue portion such that actuation of said actuator bends said elongate tongue portion toward the underlying reference surface to thereby move said stage in the Z direction.

11. A microelectromechanical positioning apparatus according to claim 7 wherein said actuator is a thermal bimorph structure comprised of first and second layers, and wherein said first layer has a larger coefficient of expansion than the second layer.

12. A microelectromechanical positioning apparatus according to claim 7 wherein said stage defines several apertures opening through the recessed portion of the first surface of said stage to thereby improve the flexibility of said stage.

13. A microelectromechanical positioning apparatus according to claim 7 further comprising at least one spring extending between said support and said stage for suspending said stage adjacent said support and above the reference surface.

14. A microelectromechanical positioning apparatus comprising:
   a reference surface;
   a support disposed in a fixed position relative to the reference surface;
   a stage having opposed first and second major surfaces and defining an XY plane, wherein said stage is suspended from said support and over at least a portion of the reference surface such that the first major surface faces the reference surface; wherein said stage defines an elongate tongue portion; and an actuator disposed on said elongate tongue portion of said stage such that actuation of said actuator bends said elongate tongue portion toward the underlying reference surface to thereby move said stage in a Z direction perpendicular to the XY plane.

15. A microelectromechanical positioning apparatus according to claim 14 further comprising at least one microelectromechanical actuator disposed in a fixed position relative to said support for controllably moving said stage in the XY plane.

16. A microelectromechanical positioning apparatus according to claim 15 wherein said microelectromechanical actuator comprises:

spaced apart anchors disposed in a fixed position relative to said support;

an arched beam extending between said spaced apart anchors;

an actuator member operably coupled to said arched beam and extending outwardly therefrom toward said stage; and means for heating said arched beam to cause further arching of said beam such that said actuator member controllably positions said stage in the XY plane.

17. A microelectromechanical positioning apparatus according to claim 14 wherein a portion of the first major surface underlying said elongate tongue portion of said stage includes a recessed portion to thereby improve the flexibility of said elongate tongue portion.

18. A microelectromechanical positioning apparatus according to claim 14 wherein said actuator is a thermal bimorph structure comprised of first and second layers, and wherein said first layer has a larger coefficient of expansion than said second layer.

19. A microelectromechanical positioning apparatus according to claim 18 wherein the first layer of said actuator defines at least one slit.

20. A microelectromechanical positioning apparatus according to claim 14 further comprising at least one spring extending between said support and said stage for suspending said stage adjacent said support and above the reference surface.

* * * * *

UNITED STATES PATENT AND TRADEMARK OFFICE
CERTIFICATE OF CORRECTION

PATENT NO. : 5,962,949

DATED : October 5, 1999

INVENTOR(S) : Dhuler et al.

It is certified that error appears in the above-identified patent and that said Letters Patent is hereby corrected as shown below:

Column 12, line 3, after "surface", the colon (:) should read a semicolon (;).

Column 13, lines 10-11, "in a fixed position relative to" should read --upon--.

Signed and Sealed this

Fourth Day of April, 2000

Attest:

Q. TODD DICKINSON

Attesting Officer

Director of Patents and Trademarks